(12) United States Patent
Tanaka et al.

(10) Patent No.: US 10,957,881 B2
(45) Date of Patent: Mar. 23, 2021

(54) METHOD AND APPARATUS FOR PRODUCING FLEXIBLE OLED DEVICE

(71) Applicant: Sakai Display Products Corporation, Sakai (JP)

(72) Inventors: Kohichi Tanaka, Sakai (JP); Katsuhiko Kishimoto, Sakai (JP)

(73) Assignee: Sakai Display Products Corporation, Osaka (JP)

( * ) Notice: Subject to any disclaimer, the term of this patent is extended or adjusted under 35 U.S.C. 154(b) by 1 day.

(21) Appl. No.: 16/079,439

(22) PCT Filed: Oct. 26, 2017

(86) PCT No.: PCT/JP2017/038782
§ 371 (c)(1),
(2) Date: Aug. 23, 2018

(87) PCT Pub. No.: WO2019/082354
PCT Pub. Date: May 2, 2019

(65) Prior Publication Data
US 2019/0363306 A1 Nov. 28, 2019

(51) Int. Cl.
*H01L 51/56* (2006.01)
*H01L 51/00* (2006.01)
(Continued)

(52) U.S. Cl.
CPC .......... *H01L 51/56* (2013.01); *H01L 51/0097* (2013.01); *H01L 51/5253* (2013.01);
(Continued)

(58) Field of Classification Search
None
See application file for complete search history.

(56) References Cited

U.S. PATENT DOCUMENTS

2001/0050532 A1 12/2001 Eida et al.
2017/0125453 A1 5/2017 Hayk et al.
2017/0278878 A1 9/2017 Kuwabara et al.

FOREIGN PATENT DOCUMENTS

JP 2002-361797 A 12/2002
JP 2009-032464 A 2/2009
(Continued)

OTHER PUBLICATIONS

Decision to Grant for related Japanese Application No. 2018-511782 dated Jul. 17, 2018.
(Continued)

*Primary Examiner* — Abul Kalam
(74) *Attorney, Agent, or Firm* — Renner, Otto, Boisselle & Sklar, LLP

(57) ABSTRACT

According to a flexible OLED device production method of the present disclosure, a multilayer stack (100) is provided which includes a glass base (10), a functional layer region (20) including a TFT layer (20A) and an OLED layer (20B), and a synthetic resin film (30) provided between the glass base (10) and the functional layer region (20) and bound to the glass base (10). In a dry gas atmosphere whose dew point is not more than −50° C., the multilayer stack (100) is separated into a first portion (110) and a second portion (120), and a surface (30s) of the synthetic resin film (30) is exposed to the dry gas atmosphere, the first portion (110) including the functional layer region (20) and the synthetic resin film (30), the second portion (120) including the glass base (10). The first portion (110) is transported from the dry gas atmosphere to a reduced-pressure atmosphere R, and a protection layer (60) is formed on the surface (30s) of the synthetic resin film (30) in the reduced-pressure atmosphere R.

13 Claims, 9 Drawing Sheets

(51) Int. Cl.
*H01L 51/52* (2006.01)
*H01L 27/32* (2006.01)
(52) U.S. Cl.
CPC .... *H01L 27/3244* (2013.01); *H01L 2227/326* (2013.01); *H01L 2251/5338* (2013.01); *H01L 2251/566* (2013.01)

(56) References Cited

FOREIGN PATENT DOCUMENTS

| | | |
|---|---|---|
| JP | 2011-142168 A | 7/2011 |
| JP | 5225024 B2 | 7/2013 |
| JP | 2014007309 | 1/2014 |
| JP | 2014-048619 A | 3/2014 |
| JP | 2014-111365 A | 6/2014 |
| JP | 2015-017008 A | 1/2015 |
| JP | 2016-035508 A | 3/2016 |
| JP | 2016-173944 A | 9/2016 |
| JP | 2017-183717 A | 10/2017 |
| WO | 0158221 | 8/2001 |

OTHER PUBLICATIONS

Office Action for related Japanese Application No. 2018-511782 dated Apr. 24, 2018 and English translation.
PCT International Search Report for related International Application No. PCT/JP2017/038782 dated Jan. 30, 2018.

LIFT-OFF LIGHT

METHOD AND APPARATUS FOR PRODUCING FLEXIBLE OLED DEVICE

TECHNICAL FIELD

The present disclosure relates to a method and apparatus for producing a flexible OLED device.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the above-described flexible display is carried out using a glass base on which a plastic film is formed over the upper surface. The glass base functions as a support (carrier) for keeping the shape of the plastic film flat during the production process. Elements such as TFTs and OLEDs, a gas barrier film, and the other constituents are formed on the plastic film, whereby the structure of a flexible device is realized while it is supported by the glass base. Thereafter, the flexible device is delaminated from the glass base and gains flexibility. The entirety of a portion in which elements such as TFTs and OLEDs are arrayed can be referred to as "functional layer region".

According to the prior art, a sheet-like structure including a plurality of flexible devices is delaminated from a glass base, and thereafter, optical parts and other constituents are mounted to this sheet-like structure. Thereafter, the sheet-like structure is divided into a plurality of flexible devices.

Patent Document No. 1 discloses the method of irradiating the interface between each flexible device and the glass base with laser light (lift-off light) in order to delaminate each flexible device from the glass base (supporting substrate). According to the method disclosed in Patent Document No. 1, after irradiation with the lift-off light, respective flexible devices are divided from one another, and each of the flexible devices is delaminated from the glass base.

CITATION LIST

Patent Literature

Patent Document No. 1: Japanese Laid-Open Patent Publication No. 2014-48619

SUMMARY OF INVENTION

Technical Problem

According to research conducted by the present inventors, a flexible OLED device produced by a conventional production method does not have sufficient moisture resistance.

The present disclosure provides a method and apparatus for producing a flexible OLED device which are capable of solving the above-described problems.

Solution to Problem

A flexible OLED device production method of the present disclosure includes, in an exemplary embodiment, providing a multilayer stack, the multilayer stack including a glass base, a functional layer region including a TFT layer and an OLED layer, and a synthetic resin film provided between the glass base and the functional layer region and bound to the glass base; and separating the multilayer stack into a first portion and a second portion in a dry gas atmosphere whose dew point is not more than −50° C., thereby exposing a surface of the synthetic resin film to the dry gas atmosphere, the first portion including the functional layer region and the synthetic resin film, the second portion including the glass base; and transporting the first portion of the multilayer stack from the dry gas atmosphere to a reduced-pressure atmosphere and forming a protection layer on the surface of the synthetic resin film in the reduced-pressure atmosphere.

In one embodiment, forming a protection layer on the surface of the synthetic resin film in the reduced-pressure atmosphere includes forming a layer of a dielectric and/or electric conductor on the surface of the synthetic resin film by physical vapor deposition.

In one embodiment, the protection layer includes a metal layer.

In one embodiment, the metal layer is made of aluminum or copper.

In one embodiment, the metal layer is deposited so as to have a thickness based on a surface roughness of the surface of the synthetic resin film.

In one embodiment, a thickness of the metal layer is not less than 5 nm and not more than 200 nm.

In one embodiment, a thickness of the metal layer is more than 200 nm and not more than 1 μm.

In one embodiment, separating the multilayer stack into the first portion and the second portion includes irradiating an interface between the synthetic resin film and the glass base with laser light.

In one embodiment, separating the multilayer stack into the first portion and the second portion includes sliding a blade at an interface between the synthetic resin film and the glass base.

In one embodiment, separating the multilayer stack into the first portion and the second portion includes supplying an ion into the dry gas atmosphere using an ionizer.

In one embodiment, the method further includes, after forming the protection layer on the surface of the synthetic resin film in the reduced-pressure atmosphere, mounting an electronic part or an optical part to the first portion of the multilayer stack in an environmental atmosphere.

In one embodiment, the method further includes, before exposing a surface of the synthetic resin film to the dry gas atmosphere, adhering a protection sheet to the functional layer region.

In one embodiment, the functional layer region includes a plurality of functional layer regions, the synthetic resin film includes a plurality of flexible substrate regions respectively supporting the plurality of functional layer regions and an intermediate region surrounding the plurality of flexible substrate regions, and the method further includes, after forming the protection layer on the surface of the synthetic resin film, dividing the intermediate region and respective ones of the plurality of flexible substrate regions of the synthetic resin film from one another.

In one embodiment, dividing the intermediate region and respective ones of the plurality of flexible substrate regions of the synthetic resin film from one another precedes exposing a surface of the synthetic resin film to the dry gas atmosphere.

A flexible OLED device production apparatus of the present disclosure includes, in an exemplary embodiment, a lift-off unit which includes a stage for supporting a multilayer stack, the multilayer stack including a glass base, a functional layer region including a TFT layer and an OLED layer, and a synthetic resin film provided between the glass base and the functional layer region and bound to the glass base, the lift-off unit being capable of forming a dry gas atmosphere whose dew point is not more than −50° C. and separating the multilayer stack into a first portion and a second portion in the dry gas atmosphere, thereby exposing a surface of the synthetic resin film to the dry gas atmosphere, the first portion including the functional layer region and the synthetic resin film, the second portion including the glass base; and a surface treatment unit capable of forming a reduced-pressure atmosphere, receiving the first portion of the multilayer stack from the lift-off unit without exposing the first portion of the multilayer stack to atmospheric air, and forming a protection layer on the surface of the synthetic resin film in the reduced-pressure atmosphere.

In one embodiment, the apparatus further includes an ionizer for supplying an ion into the dry gas atmosphere.

In one embodiment, the lift-off unit includes a light source for irradiating an interface between the synthetic resin film and the glass base with laser light.

In one embodiment, the apparatus further includes a mechanism for sliding a blade at an interface between the synthetic resin film and the glass base.

Advantageous Effects of Invention

According to an embodiment of the present invention, the moisture resistance of a flexible OLED device is improved.

DESCRIPTION OF EMBODIMENTS

Conventionally, a surface of a plastic film delaminated from a glass base by irradiation with lift-off light is thereafter exposed to the atmospheric air. According to experiments by the present inventors, it was found that if the surface of the plastic film immediately after being delaminated is brought into contact with the atmospheric air even in a short time period, the surface adsorbs and absorbs water vapor in the atmospheric air and, after that, the absorbed water vapor can affect the reliability of an OLED device. Particularly, the polyimide film has high hygroscopicity. When a polyimide film which has a thickness of about 15 µm is placed in an environmental atmosphere whose temperature is 23° C. and relative humidity is 50%, the polyimide film absorbs water vapor in the atmosphere for several minutes to several tens of minutes and bends, and the moisture permeates the polyimide film. The moisture permeating the polyimide film that functions as a flexible substrate can function as a source of moisture during the operation of the OLED device and therefore deteriorates the reliability of the OLED device and can shorten the product life.

In a method and apparatus for producing a flexible OLED device of the present disclosure, for the purpose of solving such problems, a plastic film is delaminated in a dry atmosphere and, thereafter, a surface treatment on the plastic film is carried out without exposing the plastic film to the atmospheric air. Thus, the reliability of the flexible OLED device can be improved, and the product life can be extended.

Hereinafter, an embodiment of the present disclosure is described. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventors provide the attached drawings and the following description for the purpose of assisting those skilled in the art to fully understand the present disclosure. Providing these drawings and description does not intend to limit the subject matter recited in the claims.

EMBODIMENT

The outline of a method and apparatus for producing a flexible OLED device of the present disclosure is described with reference to the drawings.

Figure 1A:
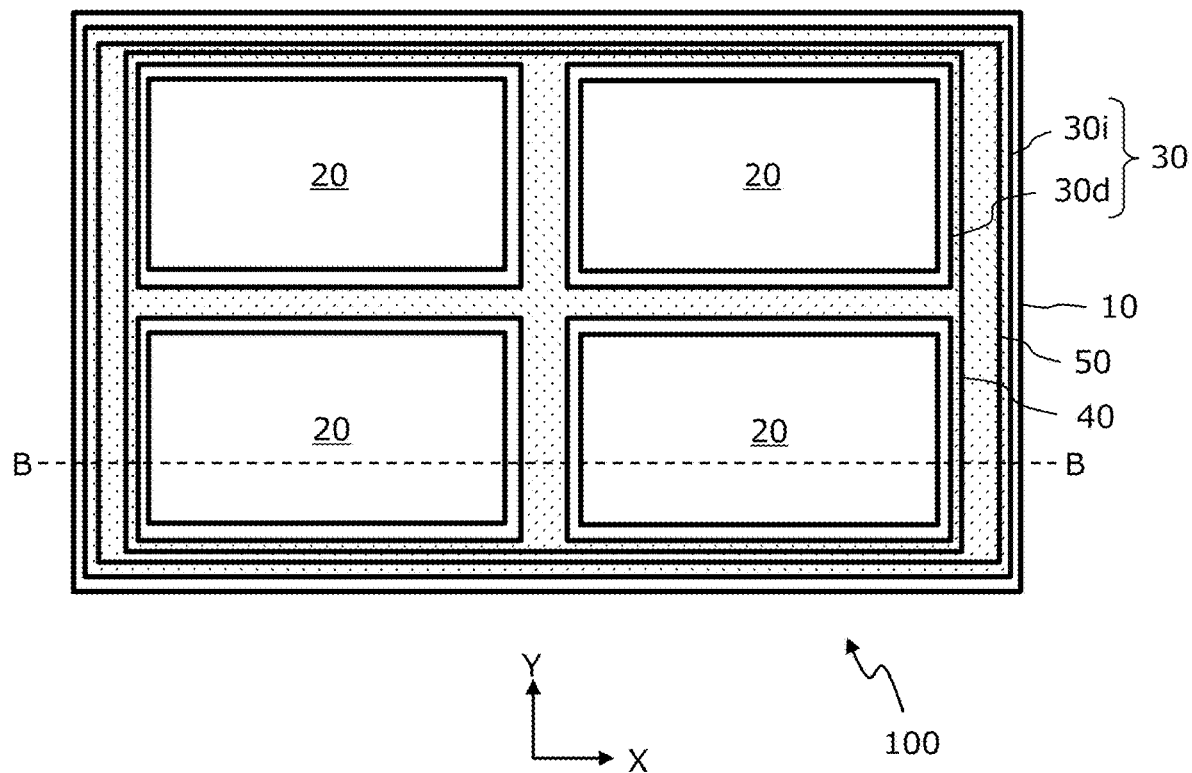
FIG. 1A is a plan view showing a configuration example of a multilayer stack used in a flexible OLED device production method of the present disclosure.
Figure 1B:
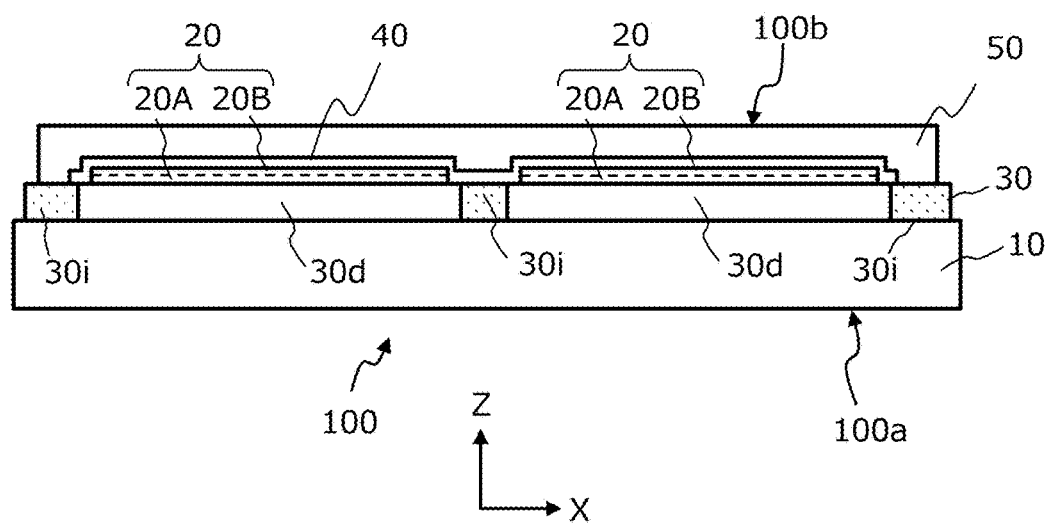
FIG. 1B is a cross-sectional view of the multilayer stack taken along line B-B of FIG. 1A.

See FIG. 1A and FIG. 1B. In a flexible OLED device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 includes a glass base (motherboard or carrier) 10, a plurality of functional layer regions 20 each including a TFT layer 20A and an OLED layer 20B, and a synthetic resin film (hereinafter, simply referred to as "plastic film") 30 provided between the glass base 10 and the plurality of functional layer regions 20 and bound to the glass base 10. The multilayer stack 100 further includes a gas barrier film 40 and a protection sheet 50 covering the entirety of the plurality of functional layer regions 20. The multilayer stack 100 may include another unshown layer, such as a buffer layer.

The first surface 100a of the multilayer stack 100 is defined by the glass base 10. The second surface 100b of the multilayer stack 100 is defined by the protection sheet 50. The glass base 10 and the protection sheet 50 are materials temporarily used in the production process but are not constituents of a final flexible OLED device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions 20 is a constituent of a final flexible OLED device. In other words, the multilayer stack 100 has such a structure that a plurality of flexible OLED devices which are not yet divided from one another are supported by a single glass base. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible OLED device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 supported by a single glass base 10 does not need to be plural but may be singular. If the number of functional layer regions 20 is singular, the intermediate region 30i of the plastic film 30 forms a simple frame pattern surrounding a single functional layer region 20.

The size or proportion of each component illustrated in respective drawings is determined from the viewpoint of understandability. The actual size or proportion is not necessarily reflected in the drawings.

Figure 1C:
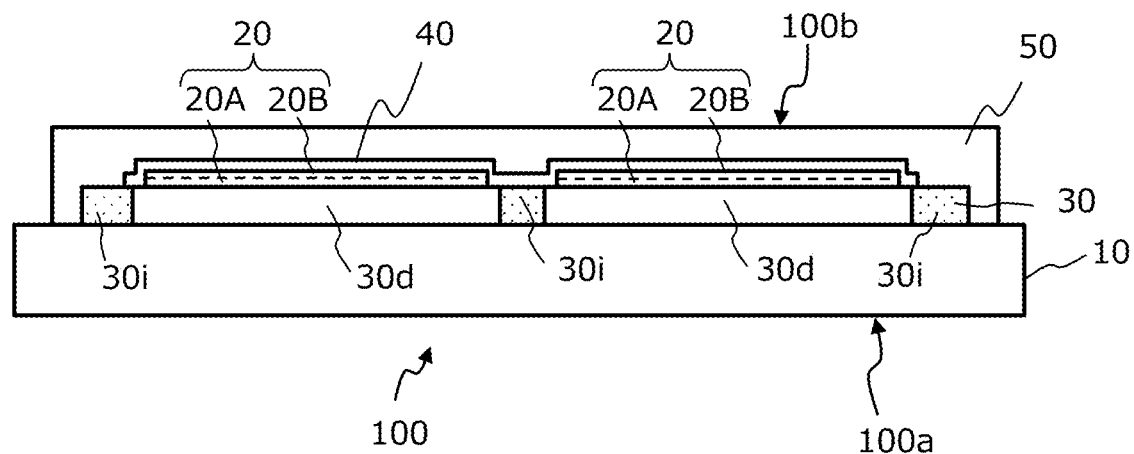
FIG. 1C is a cross-sectional view showing another example of the multilayer stack.
Figure 1D:
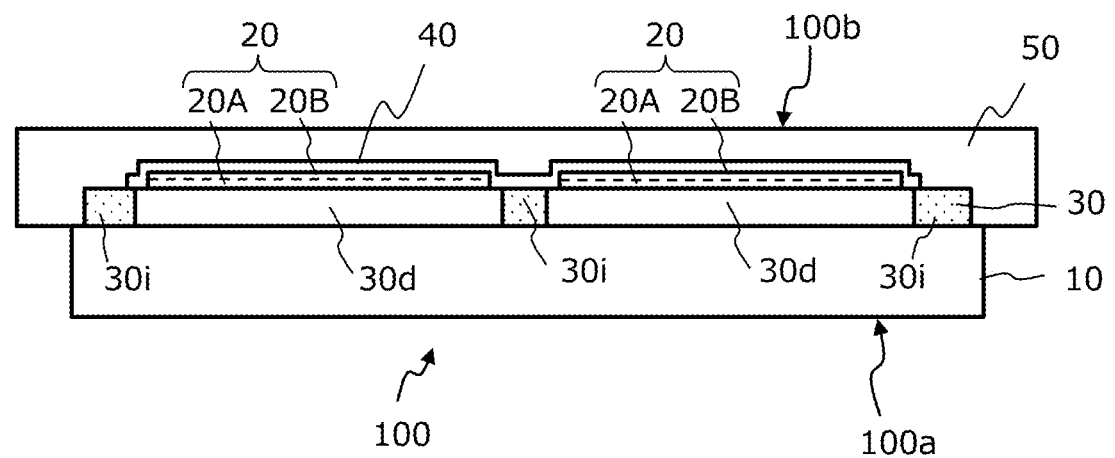
FIG. 1D is a cross-sectional view showing still another example of the multilayer stack.

The multilayer stack 100 which can be used in the production method of the present disclosure is not limited to the example illustrated in FIG. 1A and FIG. 1B. FIG. 1C and FIG. 1D are cross-sectional views showing other examples of the multilayer stack 100. In the example illustrated FIG. 1C, the protection sheet 50 covers the entirety of the plastic film 30 and extends outward beyond the plastic film 30. In the example illustrated FIG. 1D, the protection sheet 50 covers the entirety of the plastic film 30 and extends outward beyond the glass base 10. As will be described later, after the glass base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the glass base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface.

The more detailed description of the multilayer stack 100 will be described later.

Figure 2:
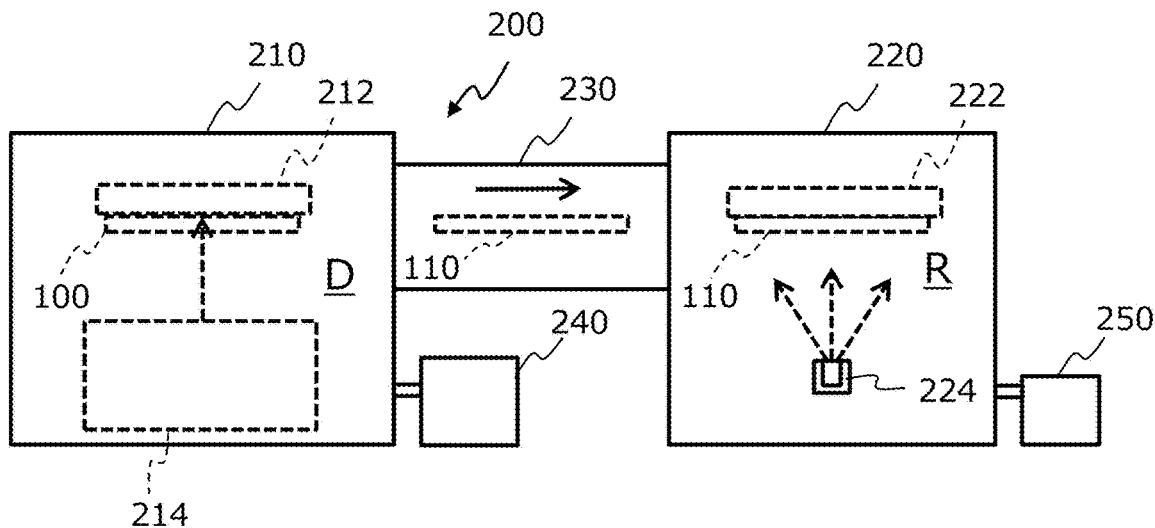
FIG. 2 is a diagram schematically showing a configuration example of a flexible OLED device production apparatus of the present disclosure.

See FIG. 2. FIG. 2 is a diagram schematically showing a configuration example of a flexible OLED device production apparatus 200 of the present disclosure. The production apparatus 200 shown in the drawing includes a lift-off unit 210 and a surface treatment unit 220. In the example illustrated in FIG. 2, the lift-off unit 210 and the surface treatment unit 220 are in communication with each other via a transportation space 230. A part or the entirety of the transportation space 230 functions as a load lock chamber of the surface treatment unit 220.

Figure 3A:
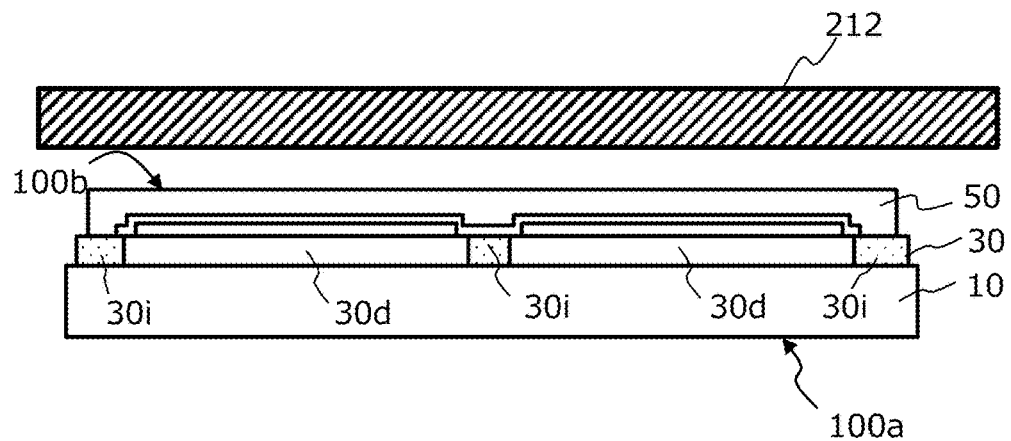
FIG. 3A is a diagram schematically showing a state immediately before a stage supports a multilayer stack.

The lift-off unit 210 includes a stage 212 for supporting the multilayer stack 100. FIG. 3A is a diagram schematically showing a state immediately before the stage 212 supports the multilayer stack 100. The multilayer stack 100 is arranged such that the second surface 100b of the multilayer stack 100 faces the stage 212. The multilayer stack 100 is supported by the stage 212.

Figure 3B:
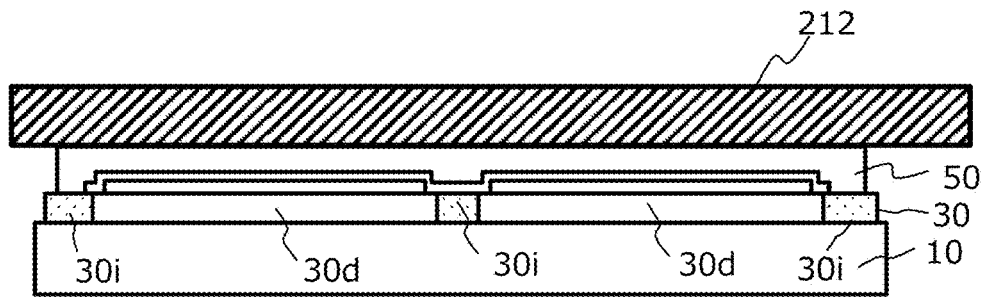
FIG. 3B is a diagram schematically showing a state where the stage supports the multilayer stack.

FIG. 3B schematically shows a state where the stage 212 supports the multilayer stack 100. The arrangement of the stage 212 and the multilayer stack 100 is not limited to the example illustrated in the drawing. For example, the multilayer stack 100 may be placed upside down such that the stage 212 is present under the multilayer stack 100.

A form which allows the stage 212 to support the multilayer stack 100 is also arbitrary. The surface of the stage 212 may hold the multilayer stack 100 by suction using a vacuum chuck. Alternatively, a securing device (not shown) attached to the stage 212 may mechanically hold the multilayer stack 100. In the example illustrated in FIG. 3B, the second surface 100b of the multilayer stack 100 is in contact with the stage 212 and is adhered by suction to the stage 212. In this example, the stage 212 functions as a "chuck stage".

The lift-off unit 210 forms a dry gas atmosphere D whose dew point is not more than −50° C. and separates the multilayer stack 100 in the dry gas atmosphere D into two portions (the first portion 110 and the second portion 120 of FIG. 3D) as will be described later.

Figure 3C:
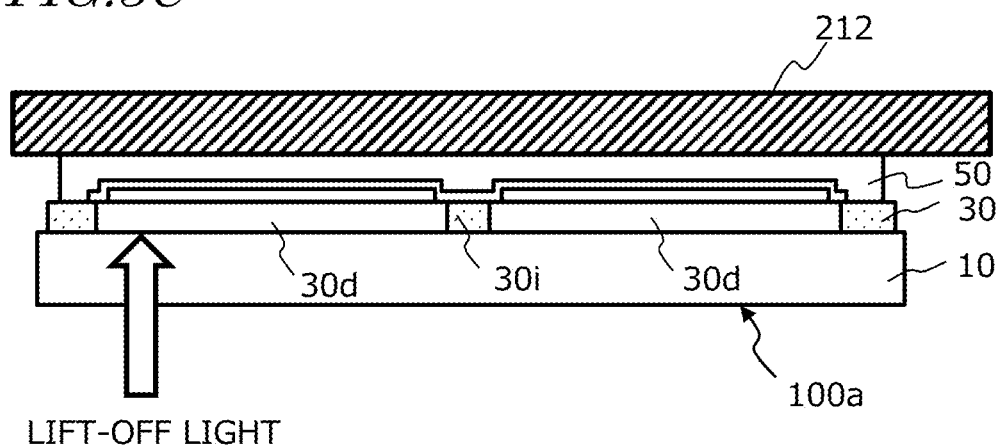
FIG. 3C is a diagram schematically showing that the interface between a glass base and a plastic film of the multilayer stack with laser light (lift-off light) in the shape of a line.

FIG. 3C schematically illustrates irradiation of the interface between the glass base 10 and the plastic film 30 of the multilayer stack 100 with laser light (lift-off light) in the shape of a line extending in a direction vertical to the sheet of the drawing. A part of the plastic film 30 at the interface between the glass base 10 and the plastic film 30 absorbs the lift-off light and decomposes (disappears). By scanning the above-described interface with the lift-off light, the degree of binding of the plastic film 30 to the glass base 10 is reduced. The wavelength of the lift-off light is typically in the ultraviolet band. The wavelength of the lift-off light is selected such that the lift-off light is hardly absorbed by the glass base 10 but is absorbed by the plastic film 30 as much as possible. The light absorption by the glass base 10 is, for example, about 10% in the wavelength range of 343-355 nm but can increase to 30-60% at 308 nm.

When the lift-off unit 210 is a laser lift-off (LLO) unit for carrying out lift-off by irradiation with laser light (lift-off light), the lift-off unit 210 includes a line beam source 214. The line beam source 214 includes a laser device and an optical system for shaping laser light emitted from the laser device into a line beam.

Figure 4:
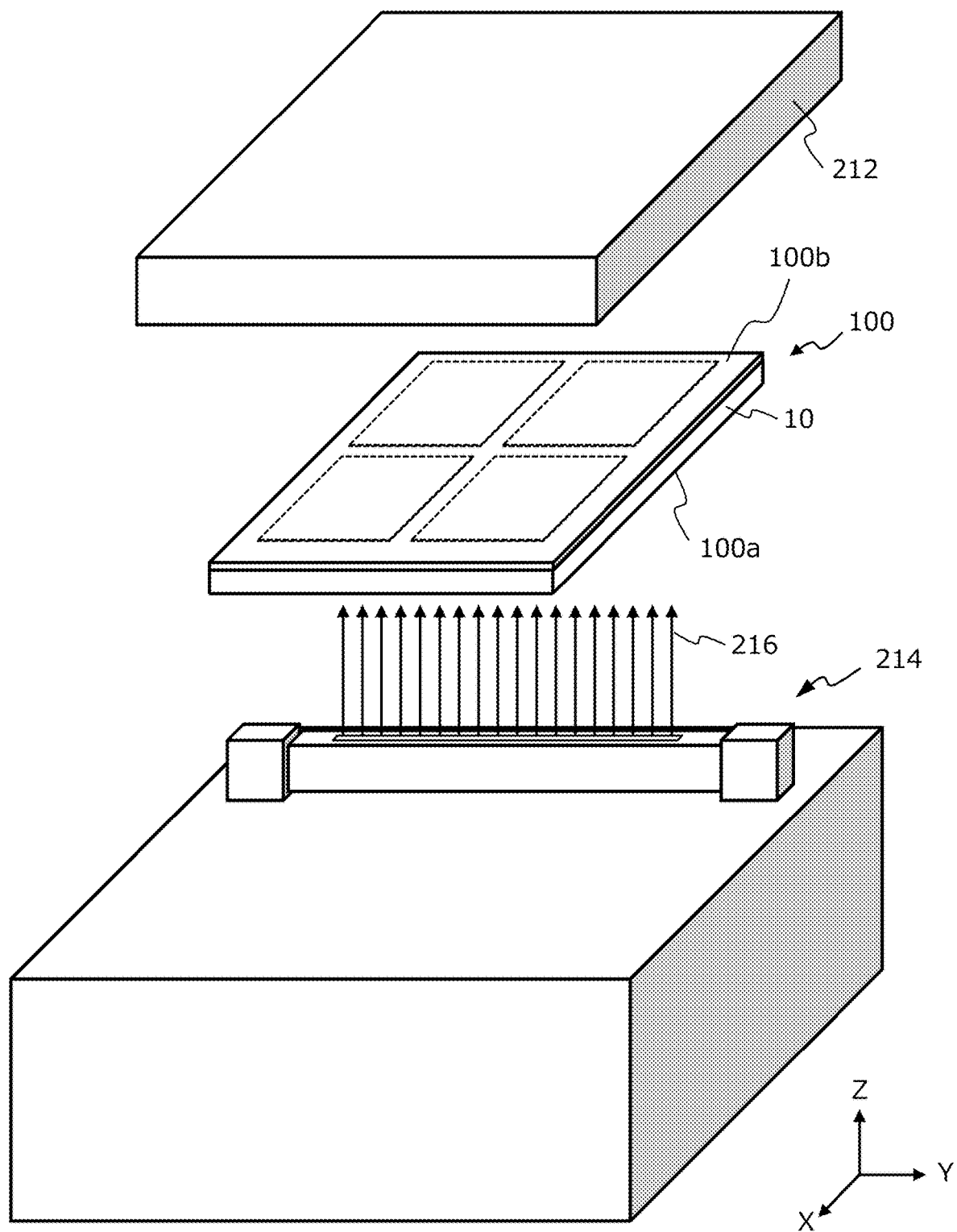
FIG. 4 is a perspective view schematically showing irradiation with lift-off light.

FIG. 4 is a perspective view schematically showing irradiation of the multilayer stack 100 with a line beam emitted from the line beam source 214. For the sake of understandability, the stage 212, the multilayer stack 100 and the line beam source 214 are shown as being spaced away from one another in the Z-axis direction of the drawing. During irradiation with the lift-off light, the multilayer stack 100 is in contact with the stage 212.

Examples of the laser device include gas laser devices such as excimer laser, solid laser devices such as YAG laser, semiconductor laser devices, and other types of laser devices. A XeCl excimer laser device can generate laser light at the wavelength of 308 nm. When yttrium orthovanadate ($YVO_4$) doped with neodymium (Nd) or $YVO_4$ doped with ytterbium (Yb) is used as a lasing medium, the wavelength of laser light (fundamental wave) emitted from the lasing medium is about 1000 nm. Therefore, the fundamental wave can be converted by a wavelength converter to laser light at the wavelength of 340-360 nm (third harmonic wave) before it is used.

The irradiation with the lift-off light can be carried out with the power density (irradiance) of, for example, 250-300 mJ/cm². The lift-off light in the shape of a line beam has a size which can extend across the glass base 10, i.e., a line length which exceeds the length of one side of the glass base (long axis dimension, size in Y-axis direction of FIG. 4). The line length can be, for example, not less than 750 mm. Meanwhile, the line width of the lift-off light (short axis dimension, size in X-axis direction of FIG. 4) can be, for example, about 0.2 mm. These dimensions represent the size of the irradiation region at the interface between the plastic film 30 and the glass base 10. The lift-off light can be emitted in the form of a pulsed or continuous wave. Irradiation with the pulsed wave can be carried out at the frequency of, for example, about 200 times per seconds.

The position of irradiation with the lift-off light moves relative to the glass base 10 for scanning with the lift-off light. In the lift-off unit 210, the multilayer stack 100 may be movable while the light source from which the lift-off light is to be emitted and an optical unit are stationary and, alternatively, the light source may be movable while the multilayer stack 100 is stationary. In the example illustrated in FIG. 4, scanning with the lift-off light is carried out in the X-axis direction.

Figure 3D:
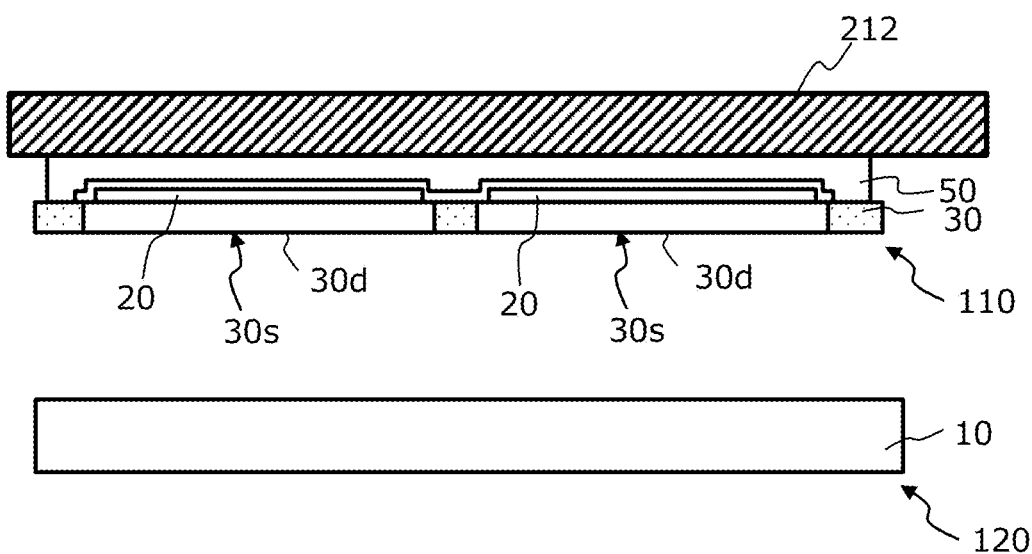
FIG. 3D is a diagram schematically showing the multilayer stack separated into the first portion and the second portion after irradiation with lift-off light.

FIG. 3D is a diagram schematically showing the multilayer stack 100 separated into the first portion 110 and the second portion 120 after irradiation with lift-off light. The first portion 110 includes functional layer regions 20 and a plastic film 30. A final flexible OLED device is produced from the first portion 110. Meanwhile, the second portion 120 includes a glass base 10. Although a substantial constituent of the second portion 120 is the glass base 10, a part of the plastic film 30 adhered to the glass base 10 may be included in the second portion.

Separating the multilayer stack 100 into the first portion 110 and the second portion 120 means delaminating the glass base 10 from the multilayer stack 100. As a result of this separation (delamination), a surface (delamination surface) 30s of the plastic film 30 is exposed to the dry gas atmosphere D. As previously described, the plastic film 30 such as polyimide film has high hygroscopicity, but the vapor pressure of the dry gas atmosphere D whose dew point is not more than −50° C. is extremely low. Specifically, when the dew point is not more than −50° C., the mass of water vapor which can be present in a space of one cubic meter is not more than 0.0382 grams. That is, the absolute humidity of the dry gas atmosphere D is not more than 0.0382 g/m³. When the temperature of the dry gas atmosphere D is 25° C. and the pressure is 1 atm, the relative humidity is not more than 0.2% RH. In such a dry atmosphere gas, even the surface 30s of the plastic film 30 immediately after the delamination scarcely absorbs water vapor.

To form the dry gas atmosphere D, the lift-off unit 210 is connected with a dry gas supplying unit 240 as shown in FIG. 2. A typical example of a gas that is a constituent of the dry gas is nitrogen. A part or the entirety of the dry gas atmosphere may be an inert gas such as argon or may contain a gaseous constituent which is a constituent of the atmospheric air, such as oxygen and carbon dioxide. The dry gas supplying unit 240 includes an unshown dehumidification rotor for dehumidification with the supply of a gas or atmospheric air which is not yet dehumidified from an external environment. The configuration of the dry gas supplying unit 240 is not particularly limited so long as the dry gas supplying unit 240 can generate a dry gas whose dew point is not more than −50° C.

The lift-off unit 210 does not need to be a LLO unit which performs lift-off by irradiation with laser light (lift-off light). The lift-off unit 210 may have a mechanical delamination (mechanical lift-off: MLO) mechanism which is capable of inserting a blade into the interface between the plastic film 30 and the glass base 10 and sliding the blade along the interface. When the delamination is carried out with a blade, the surface roughness of the surface 30s of the plastic film 30 is relatively low, and the surface 30s is smooth as compared with a case where the delamination is carried out by irradiation with lift-off light. When the delamination is carried out by irradiation with lift-off light, there are residues (ashes) of laser abrasion on the surface 30s of the plastic film 30 and, therefore, the surface roughness has a tendency to increase. As the surface roughness increases, the surface area increases, and the surface 30s becomes active. Thus, disadvantageously, the surface 30s is likely to adsorb water vapor in the atmospheric air.

Even when the delamination is carried out by irradiation with lift-off light, providing a delamination layer (sacrificial layer) between the plastic film 30 and the glass base 10 can improve the smoothness of the surface 30s of the plastic film 30 after the delamination. As the smoothness of the surface 30s of the plastic film 30 becomes higher, the thickness of a protection layer to be formed can advantageously be reduced.

When the delamination is carried out in the dry gas atmosphere D, static electricity is likely to occur because the atmosphere is dry. The lift-off unit 210 may include an ionizer for removal of electricity. The ionizer functions as a static electricity removing device. When the delamination surface gradually increases between the first portion 110 and the second portion 120 of the multilayer stack 100, the largest static electricity is likely to occur at the position where the plastic film 30 is delaminated from the glass base (delamination beginning position). When the glass base 10 is large, moving the position of the ionizer according to movement of the delamination beginning position is effective.

The inside of the transportation space 230 can form a dry gas atmosphere D whose dew point is not more than −50° C. as can the inside of the lift-off unit 210. The pressure inside the transportation space 230 is once reduced when the first portion 110 of the multilayer stack 100 is transported into the surface treatment unit 220. Openable and closable partitions are provided between the transportation space 230 and the lift-off unit 210 and between the transportation space 230 and the surface treatment unit 220. Each of the lift-off unit 210 and the surface treatment unit 220 can form a space temporarily separated from the transportation space 230.

The surface treatment unit 220 of FIG. 2 receives the first portion 110 of the multilayer stack 100 via the transportation space 230. The surface treatment unit 220 generates a reduced-pressure atmosphere R and performs a surface treatment on the plastic film 30 of the first portion 110 in the reduced-pressure atmosphere R. One of specific examples of this surface treatment is vapor deposition of a metal.

Figure 5A:
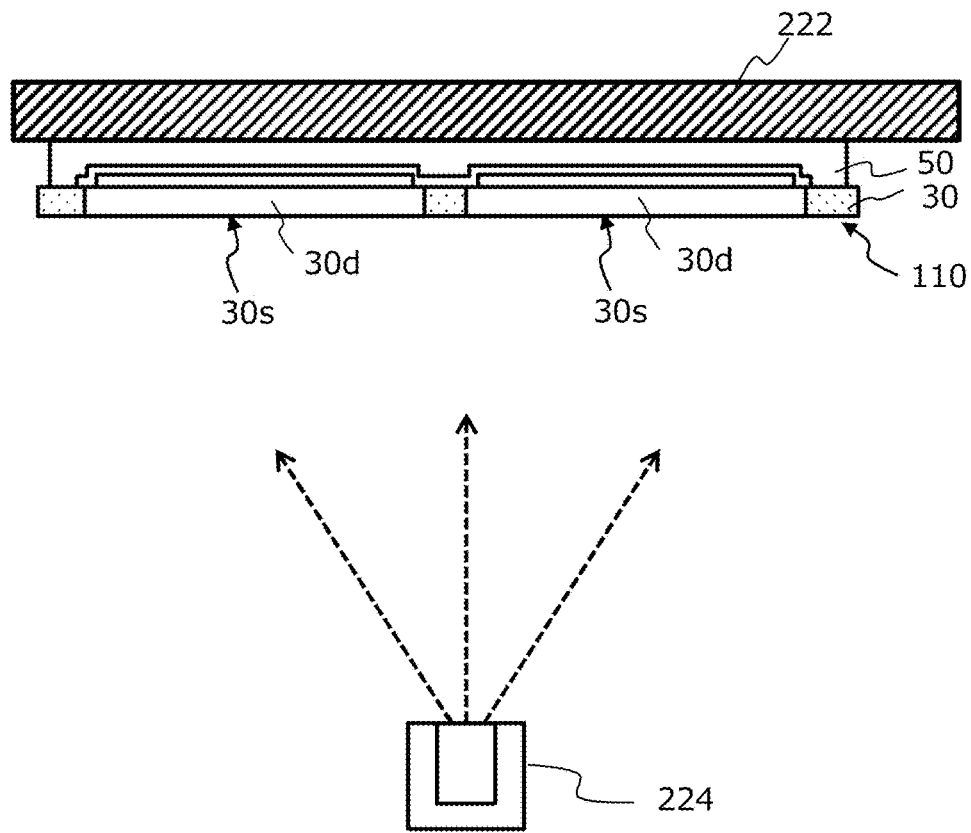
FIG. 5A is a diagram schematically showing evaporation of atoms or atom groups of a metal from a vapor deposition source.

FIG. 5A is a diagram schematically showing evaporation of atoms or atom groups of a metal from a vapor deposition source 224. The first portion 110 of the multilayer stack 100 is supported by a stage 222. The first portion 110 of the multilayer stack 100, which has been separated from the glass base 10, lacks rigidity. Therefore, the stage 222 may have a mechanism of maintaining the first portion 110 of the multilayer stack 100 horizontal by applying tension to, for example, the edges of the protection sheet 50 in a horizontal direction. The stage 222 may tightly adhere to the protection sheet 50 via an electrostatic chuck or adhesive material (adhesive agent or the like) so as to hold the first portion 110 of the multilayer stack 100.

The stage 222 may be a different stage from the stage 212 of the lift-off unit 210. Alternatively, the stage 222 may be the stage 212 transported from the lift-off unit 210 into the surface treatment unit 220 via the transportation space 230. When the same stage is used, an example of the stage 212 (222) is a stage which is capable of holding the first portion 110 using an electrostatic chuck or adhesive material, or the like. When different stages are used, an example of the stage 212 is a chuck stage, while an example of the stage 222 is a stage which is capable of holding the first portion 110 using an electrostatic chuck or adhesive material, or the like.

When the stage 222 and the stage 212 are different stages, the first portion 110 of the multilayer stack 100 which lacks rigidity after removal of the glass base 10 as shown in FIG. 3D needs to be moved from the stage 212 to the stage 222. This moving needs to be carried out in the dry gas atmosphere D such that the first portion 110 is not exposed to the atmospheric air. To carry out an efficient process, it is desirable that the stage 212 of the lift-off unit 210 is transported into the surface treatment unit 220 via the transportation space 230 while the stage 212 keeps supporting the first portion 110 of the multilayer stack 100, and is then used as the stage 222 for the surface treatment.

Atoms or atom groups of a metal evaporated from the vapor deposition source 224 so as to collide with the surface 30s of the plastic film 30 are deposited on the surface 30s of the plastic film 30.

Figure 5B:
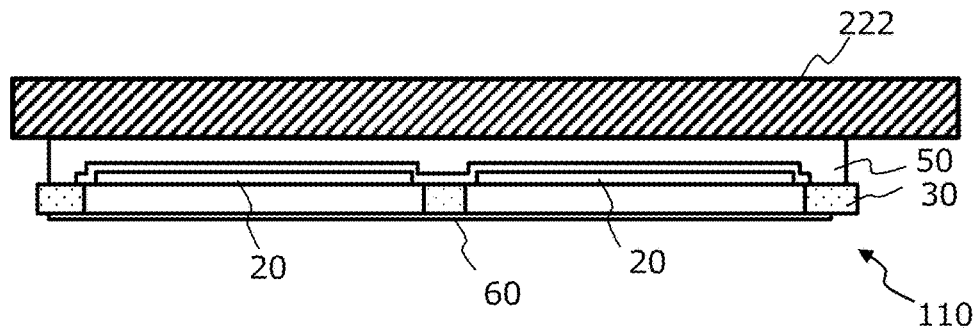
FIG. 5B is a diagram schematically showing a structure in which a protection layer is formed of a metal deposited on a surface of a plastic film.

FIG. 5B is a diagram schematically showing a structure in which a protection layer 60 is formed of a metal deposited on the surface 30s of the plastic film 30. The thickness of the protection layer 60 is adjusted according to the product of the deposition rate and the deposition duration.

As shown in FIG. 2, the surface treatment unit 220 is connected with a pressure reducing device 250, such as vacuum pump, for forming the reduced-pressure atmosphere R. When the protection layer 60 is formed by vacuum vapor deposition, the pressure of the reduced-pressure atmosphere R is, for example, from $10^{-4}$ Pa to $10^{-1}$ Pa.

An example of the surface treatment unit 220 is a vacuum vapor deposition unit of a resistance heating or electron beam heating system. In the case of a resistance heating system, the protection layer 60 can be formed by depositing a metal, such as aluminum (Al), gold (Au), silver (Ag), copper (Cu), on the surface 30s of the plastic film 30. The resistance heating system is a simple device and achieves a high deposition rate, but is limited to materials with which a sufficient vapor pressure can be achieved at a relatively low temperature such as previously described. Therefore, vapor deposition of a refractory metal whose melting point is higher than 1500° C. with the use of the resistance heating system is difficult. The electron beam heating system is capable of deposition of a refractory metal, such as titanium (Ti), molybdenum (Mo), tungsten (W), on the surface 30s of the plastic film 30, thereby forming the protection layer 60. Further, the electron beam heating system is excellent in controlling the deposition rate.

The thickness of the protection layer 60 formed on the surface 30s of the plastic film 30 can be determined according to the surface roughness of the plastic film 30. If the surface roughness of the plastic film 30 is low so that the surface is smooth, the thickness of the protection layer 60 is, for example, not less than 5 nm and not more than 200 nm. On the other hand, if the surface roughness of the plastic film 30 is high so that the surface 30s is rough, the thickness of the protection layer 60 can be more than 200 nm and not more than 1 μm. The thickness of the protection layer 60 can be set in the above-described range from the viewpoint of suppressing absorption of moisture by the plastic film 30, but can be set in a range of, for example, more than 1 μm and not more than 5 μm when the function of further improving the heat dissipation is added. To improve the heat dissipation, it is preferred that the protection layer 60 is made of a metal of high heat conductivity, e.g., Ag, Cu, Al, or the like. The heat conductivity of Cu is 403 W/m·K, which is higher than the heat conductivity of Al (236 W/m·K). When a vacuum vapor deposition unit of a resistance heating system is used, forming the protection layer 60 of Al and/or Cu, which have relatively low melting points and are inexpensive, is easy.

Another example of the surface treatment unit 220 is a sputtering device. The method of depositing a layer of Al and/or Cu on the surface 30s of the plastic film 30 may be a sputtering method. According to the sputtering method, uniform film formation can be easily realized with small deformation and variation as compared with the vacuum vapor deposition. According to the sputtering method, the kinetic energy of target atoms (molecules) is large as compared with the vacuum vapor deposition method and, therefore, a protection layer 60 which is unlikely to separate can be easily formed.

The protection layer 60 formed on the surface 30s of the plastic film 30 is not limited to a layer of a metal. The protection layer 60 can be a layer of various dielectrics and/or electric conductors which is formed on the surface 30s of the plastic film 30. The protection layer 60 may be a multilayer film. The protection layer 60 may have, for example, a layer of an applied fluoric resin or silicone resin over its surface so long as it does not adversely affect the hygroscopicity. Such a resin layer has water repellency and, therefore, the moisture resistance of the plastic film 30 can improve.

The protection layer 60 may be a reformed surface layer of the plastic film 30. The surface 30s of the plastic film 30 may be made hydrophobic by exposing the surface 30s of the plastic film 30 to, for example, a hydrocarbon gas plasma. The surface 30s of the plastic film 30 may be reformed by implanting argon ions in the surface 30s of the plastic film 30 such that the hygroscopicity decreases. The reformed surface 30s itself functions as a "protection layer" for the plastic film 30.

When a "protection layer" is formed over the surface 30s of the plastic film 30 by the above-described surface treatment, the hygroscopicity of the plastic film 30 decreases. Therefore, even if exposed to the atmospheric air after the plastic film 30 is delaminated from the glass base 10, the problem of decrease of the reliability of the OLED device which is attributed to the plastic film 30 can be solved.

Figure 5C:
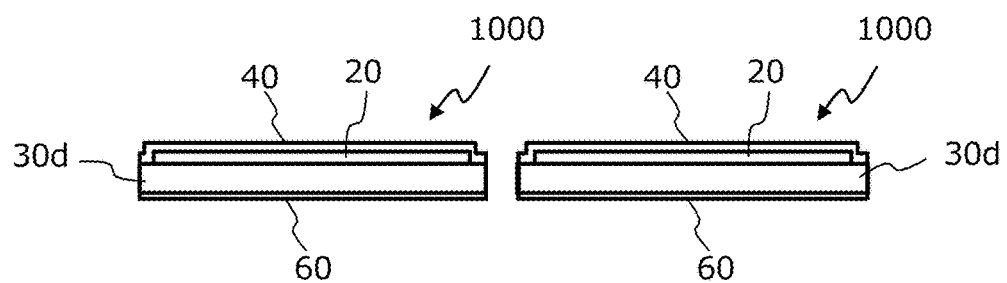
FIG. 5C is a diagram schematically showing a structure after an intermediate region and respective ones of a plurality of flexible substrate regions of the plastic film are divided from one another.

FIG. 5C is a diagram schematically showing a structure after an intermediate region 30i and respective ones of a plurality of flexible substrate regions 30d of the plastic film 30 are divided from one another. In the example illustrated in the drawing, the protection sheet 50 is also delaminated. Dividing (cutting) each of the flexible OLED devices 1000 from the first portion 110 of the multilayer stack 100 can be realized by irradiating borders to be divided with a laser beam for cutting. Such cutting can also be realized by a dicing saw instead of the laser beam irradiation.

Before the dividing, or after the dividing, various electronic or optical parts (not shown), such as driver integrated circuit, touchscreen, polarizer, heat dissipation sheet, electromagnetic shield, etc., can be mounted to each of the flexible OLED devices 1000 in, for example, the environmental atmosphere.

Figure 6:
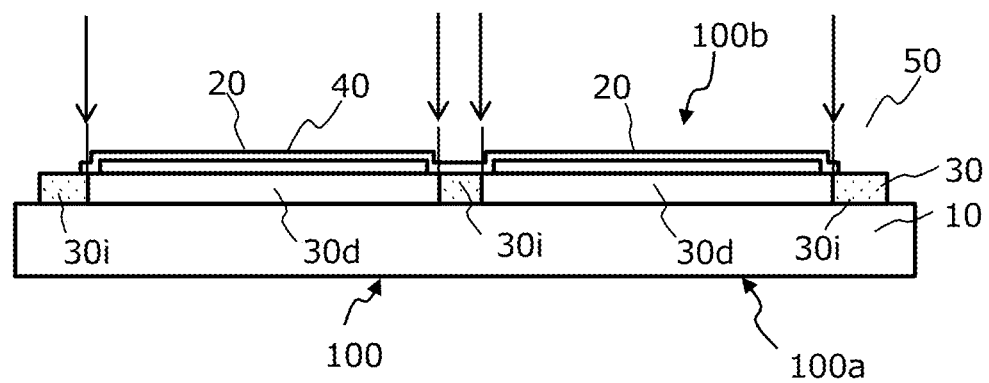
FIG. 6 is a diagram schematically showing an example where the "dividing" is carried out before the lift-off step.
Figure 7:
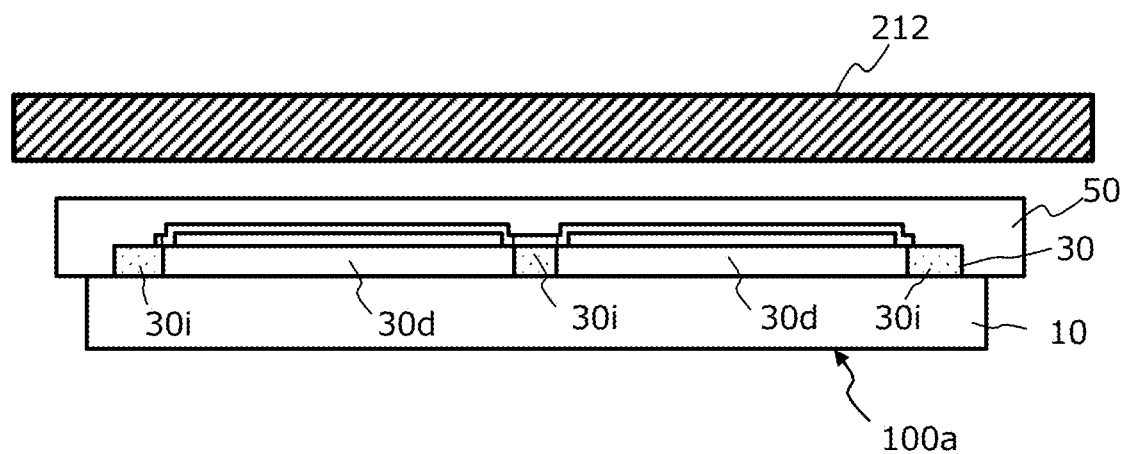
FIG. 7 is another diagram schematically showing an example where the "dividing" is carried out before the lift-off step.

FIG. 6 and FIG. 7 are diagrams schematically showing examples where the "dividing" is carried out before the lift-off step. In the example illustrated in the drawing, as shown in FIG. 6, before adhering the protection sheet 50, the intermediate region 30i and respective ones of the plurality of flexible substrate regions 30d of the plastic film 30 are divided from one another by a laser beam. Thereafter, the protection sheet 50 is adhered to the multilayer stack 100. Respective ones of the divided functional layer regions 20 are sandwiched between a single protection sheet 50 and the glass base 10. Note that the method of the dividing is not limited to this example.

The multilayer stack 100 which has the above-described configuration is supported by the stage 212 as shown in FIG. 7, and the same process as that previously described can be carried out. After the glass base 10 is delaminated from the multilayer stack 100, each of the functional layer regions 20 is still supported by the protection sheet 50, and the protection sheet 50 functions as a carrier during the production process.

When a protection layer 60 is formed on the surface 30s of the plastic film 30 by the surface treatment unit 220, this protection layer 60 can also perform the function of suppressing separation of each functional layer region 20 from the protection sheet 50.

Multilayer Stack

Hereinafter, the configuration of the multilayer stack 100 is described in more detail.

Figure 8A:
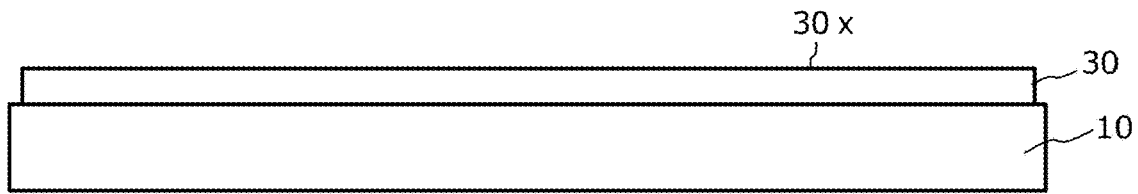
FIG. 8A is a cross-sectional view illustrating a step of the flexible OLED device production method in an embodiment of the present disclosure.

First, see FIG. 8A. FIG. 8A is a cross-sectional view showing the glass base 10 with the plastic film 30 provided on the surface of the glass base 10. The glass base 10 is a supporting substrate for processes. The thickness of the glass base 10 can be, for example, about 0.3-0.7 mm.

In the present embodiment, the plastic film 30 is a polyimide film having a thickness of, for example, not less than 5 µm and not more than 100 µm. The polyimide film can be formed from a polyamide acid, which is a precursor of polyimide, or a polyimide solution. The polyimide film may be formed by forming a polyamide acid film on the surface of the glass base 10 and then thermally imidizing the polyamide acid film. Alternatively, the polyimide film may be formed by forming, on the surface of the glass base 10, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface 30s of the glass base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin layers. In one form of the present embodiment, in delaminating a flexible display structure from the glass base 10, laser lift-off is carried out such that the plastic film 30 is irradiated with ultraviolet laser light transmitted through the glass base 10. A part of the plastic film 30 at the interface with the glass base 10 needs to absorb the ultraviolet laser light and decompose (disappear). Alternatively, for example, a sacrificial layer which is to absorb laser light of a certain wavelength band and produce a gas may be provided between the glass base 10 and the plastic film 30. In this case, the plastic film 30 can be easily delaminated from the glass base 10 by irradiating the sacrificial layer with the laser light.

<Polishing>

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

<Lower Gas Barrier Film>

Then, a gas barrier film may be formed on the plastic film 30. The gas barrier film can have various structures. Examples of the gas barrier film include a silicon oxide film and/or a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

<Functional Layer Region>

Hereinafter, the process of forming the functional layer regions 20, including the TFT layer 20A and the OLED layer 20B, and the upper gas barrier film 40 is described.

Figure 8B:
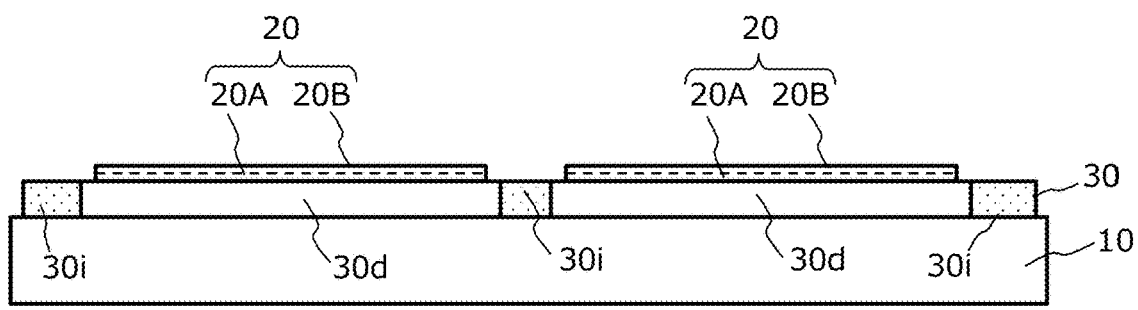
FIG. 8B is a cross-sectional view illustrating a step of the flexible OLED device production method in an embodiment of the present disclosure.

First, as shown in FIG. 8B, a plurality of functional layer regions 20 are formed on a glass base 10. There is a plastic film 30 between the glass base 10 and the functional layer regions 20. The plastic film 30 is bound to the glass base 10.

More specifically, the functional layer regions 20 include a TFT layer 20A (lower layer) and an OLED layer 20B (upper layer). The TFT layer 20A and the OLED layer 20B are sequentially formed by a known method. The TFT layer 20A includes a circuit of a TFT array which realizes an active matrix. The OLED layer 20B includes an array of OLED elements, each of which can be driven independently. The thickness of the TFT layer 20A is, for example, 4 μm. The thickness of the OLED layer 20B is, for example, 1 μm.

Figure 9:
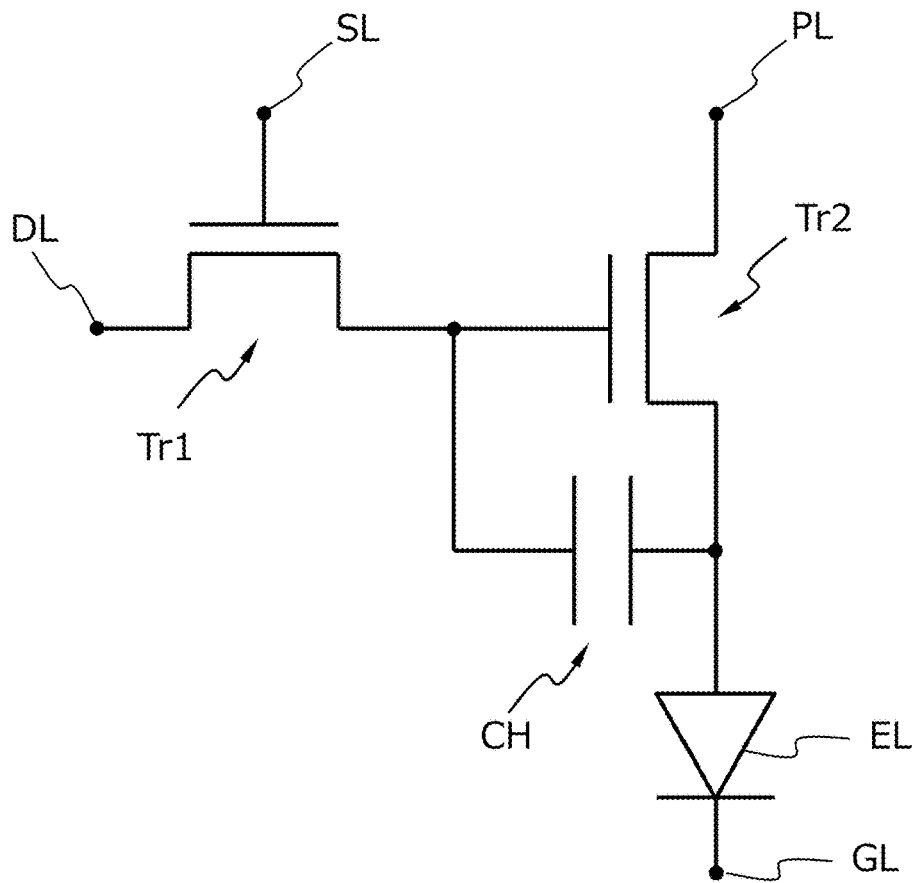
FIG. 9 is an equivalent circuit diagram of a single sub-pixel in a flexible OLED device.

FIG. 9 is a basic equivalent circuit diagram of a sub-pixel in an organic EL (Electro Luminescence) display. A single pixel of the display can consist of sub-pixels of different colors such as, for example, R (red), G (green), and B (blue). The example illustrated in FIG. 9 includes a selection TFT element Tr1, a driving TFT element Tr2, a storage capacitor CH, and an OLED element EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the OLED element EL. When the driving TFT element Tr2 is ON, an electric current flows from the power line PL to a ground line GL via the OLED element EL. This electric current allows the OLED element EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The OLED layer 20B includes an OLED element EL. Before formation of the OLED layer 20B, the upper surface of the TFT layer 20A is planarized by an interlayer insulating film that covers the TFT array and various wires. A structure which supports the OLED layer 20B and which realizes active matrix driving of the OLED layer 20B is referred to as "backplane".

The circuit elements and part of the lines shown in FIG. 9 can be included in any of the TFT layer 20A and the OLED layer 20B. The lines shown in FIG. 9 are connected with an unshown driver circuit.

In the embodiment of the present disclosure, the TFT layer 20A and the OLED layer 20B can have various specific configurations. These configurations do not limit the present disclosure. The TFT element included in the TFT layer 20A may have a bottom gate type configuration or may have a top gate type configuration. Emission by the OLED element included in the OLED layer 20B may be of a bottom emission type or may be of a top emission type. The specific configuration of the OLED element is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

<Upper Gas Barrier Film>

Figure 8C:
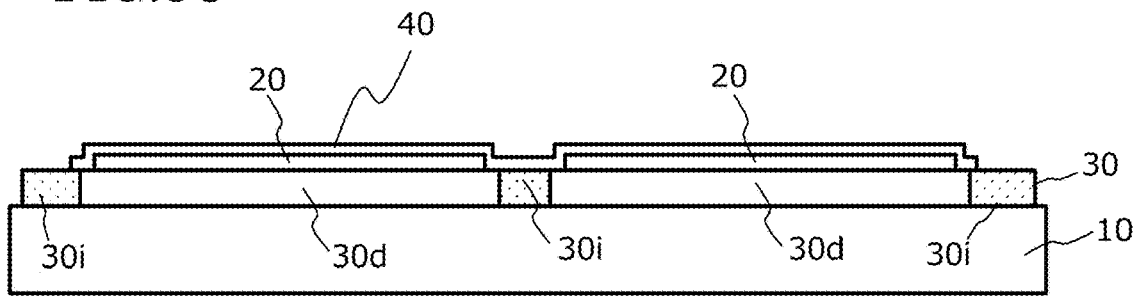
FIG. 8C is a cross-sectional view illustrating a step of the flexible OLED device production method in an embodiment of the present disclosure.

After formation of the above-described functional layer, the entirety of the functional layer regions 20 is covered with a gas barrier film (upper gas barrier film) 40 as shown in FIG. 8C. A typical example of the upper gas barrier film 40 is a multilayer film including an inorganic material layer and an organic material layer. Elements such as an adhesive film, another functional layer which is a constituent of a touchscreen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. From the viewpoint of encapsulation reliability, the WVTR (Water Vapor Transmission Rate) of a thin film encapsulation structure is typically required to be not more than $1 \times 10^{-4}$ g/m²/day. According to the embodiment of the present disclosure, this criterion is met. The thickness of the upper gas barrier film 40 is, for example, not more than 2.0 μm.

Figure 10:
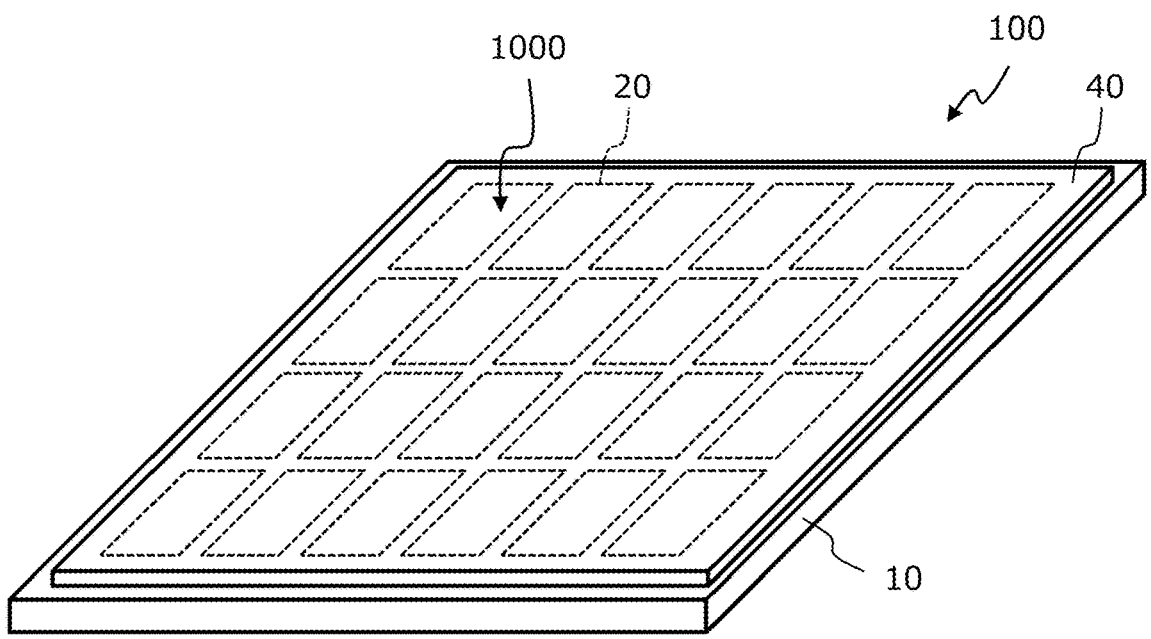
FIG. 10 is a perspective view of the multilayer stack in the middle of the production process.

FIG. 10 is a perspective view schematically showing the upper surface side of the multilayer stack 100 at a point in time when the upper gas barrier film 40 is formed. A single multilayer stack 100 includes a plurality of flexible OLED devices 1000 supported by the glass base 10. In the example illustrated in FIG. 10, a single multilayer stack 100 includes a larger number of functional layer regions 20 than in the example illustrated in FIG. 1A. As previously described, the number of functional layer regions 20 supported by a single glass base 10 is arbitrary.

<Protection Sheet>

Figure 8D:
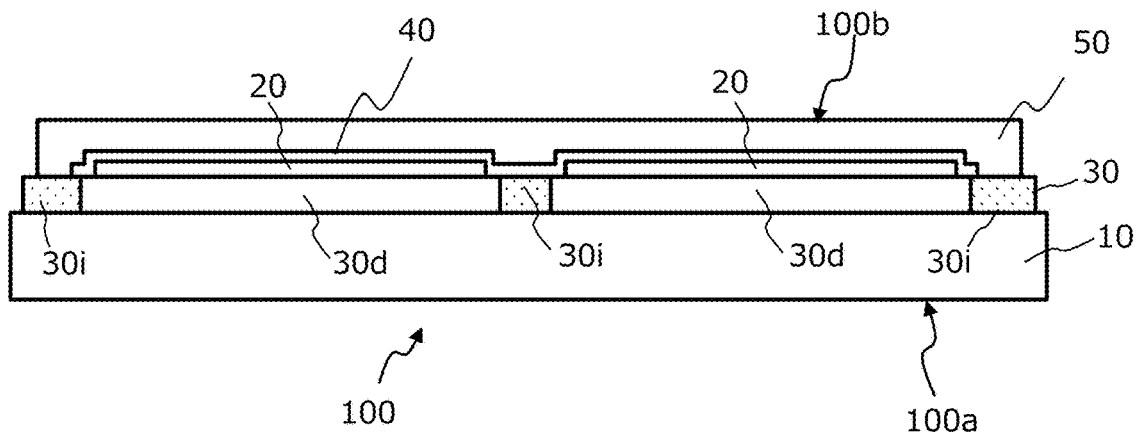
FIG. 8D is a cross-sectional view illustrating a step of the flexible OLED device production method in an embodiment of the present disclosure.

Next, refer to FIG. 8D. As shown in FIG. 8D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 μm and not more than 150 μm.

After the thus-formed multilayer stack 100 is provided, the production method of the present disclosure can be carried out using the above-described production apparatus 200. As a result, a flexible OLED device of high encapsulation property can be obtained.

INDUSTRIAL APPLICABILITY

An embodiment of the present invention provides a flexible OLED device of high encapsulation property. Such a flexible OLED device is broadly applicable to smartphones, tablet computers, on-board displays, and small-, medium- and large-sized television sets.

REFERENCE SIGNS LIST

10 . . . glass base, 20 . . . functional layer region, 20A . . . TFT layer, 20B . . . OLED layer, 30 . . . plastic film, 40 . . . gas barrier film, 50 . . . protection sheet, 100 . . . multilayer stack, 200 . . . production apparatus, 210 . . . lift-off unit, 212 . . . stage, 220 . . . surface processing unit, 1000 . . . flexible OLED device

The invention claimed is:

1. A method for producing a flexible OLED device, comprising:
   providing a multilayer stack, the multilayer stack including
      a glass base,
      a plurality of functional layer regions each including a TFT layer and an OLED layer, and
      a synthetic resin film provided between the glass base and the functional layer regions and bound to the glass base; and
   separating the multilayer stack into a first portion and a second portion in a dry gas atmosphere whose dew point is not more than −50° C., thereby exposing a surface of the synthetic resin film to the dry gas atmosphere, the first portion including the functional layer regions and the synthetic resin film, the second portion including the glass base; and
   transporting the first portion of the multilayer stack from the dry gas atmosphere to a reduced-pressure atmosphere and forming a protection layer on the surface of the synthetic resin film in the reduced-pressure atmosphere,
   wherein
   the synthetic resin film includes a plurality of flexible substrate regions respectively supporting the plurality of functional layer regions and an intermediate region surrounding the plurality of flexible substrate regions, and
   the method further includes, after forming the protection layer on the surface of the synthetic resin film, dividing the intermediate region and respective ones of the plurality of flexible substrate regions of the synthetic resin film from one another.

2. The method of claim 1, wherein forming the protection layer on the surface of the synthetic resin film in the reduced-pressure atmosphere includes forming a layer of a dielectric and/or electric conductor on the surface of the synthetic resin film by physical vapor deposition.

3. The method of claim 1, wherein forming the protection layer on the surface of the synthetic resin film in the reduced-pressure atmosphere includes forming a metal layer on the surface of the synthetic resin film by physical vapor deposition.

4. The method of claim 3, wherein the metal layer is made of aluminum or copper.

5. The method of claim 3, wherein the metal layer is deposited so as to have a thickness based on a surface roughness of the surface of the synthetic resin film.

6. The method of claim 3, wherein a thickness of the metal layer is not less than 5 nm and not more than 200 nm.

7. The method of claim 3, wherein a thickness of the metal layer is more than 200 nm and not more than 1 μm.

8. The method of claim 1, wherein separating the multilayer stack into the first portion and the second portion includes irradiating an interface between the synthetic resin film and the glass base with laser light.

9. The method of claim 1, wherein separating the multilayer stack into the first portion and the second portion includes sliding a blade at an interface between the synthetic resin film and the glass base.

10. The method of claim 1, wherein separating the multilayer stack into the first portion and the second portion includes supplying an ion into the dry gas atmosphere using an ionizer.

11. The method of claim 1 further comprising, after forming the protection layer on the surface of the synthetic resin film in the reduced-pressure atmosphere, mounting an electronic part or an optical part to the first portion of the multilayer stack in an environmental atmosphere.

12. The method of claim 1 further comprising, before exposing a surface of the synthetic resin film to the dry gas atmosphere, adhering a protection sheet to the functional layer regions.

13. A method for producing a flexible OLED device, comprising:
   providing a multilayer stack, the multilayer stack including
      a glass base,
      a plurality of functional layer regions each including a TFT layer and an OLED layer, and
      a synthetic resin film provided between the glass base and the functional layer regions and bound to the glass base, the synthetic resin film including a plurality of flexible substrate regions respectively supporting the plurality of functional layer regions and an intermediate region surrounding the plurality of flexible substrate regions;
   cutting the synthetic resin film on the glass base, thereby dividing the intermediate region and respective ones of the plurality of flexible substrate regions of the synthetic resin film from one another; and
   separating the multilayer stack into a first portion and a second portion in a dry gas atmosphere whose dew point is not more than −50° C., thereby exposing a surface of the synthetic resin film to the dry gas atmosphere, the first portion including the functional layer regions and the synthetic resin film, the second portion including the glass base; and
   transporting the first portion of the multilayer stack from the dry gas atmosphere to a reduced-pressure atmosphere and forming a protection layer on the surface of the synthetic resin film in the reduced-pressure atmosphere.

* * * * *